(12) United States Patent
Suzuki

(10) Patent No.: US 7,425,854 B2
(45) Date of Patent: Sep. 16, 2008

(54) POWER DETECTION CIRCUIT

(75) Inventor: Hideaki Suzuki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/448,706

(22) Filed: Jun. 8, 2006

(65) Prior Publication Data

US 2007/0195475 A1    Aug. 23, 2007

(30) Foreign Application Priority Data

Feb. 23, 2006 (JP) .............................. 2006-047548

(51) Int. Cl.
*H03K 3/02* (2006.01)
(52) U.S. Cl. ...................... 327/198; 327/143
(58) Field of Classification Search ................ 327/142, 327/143, 198; 361/88, 90, 91, 92
See application file for complete search history.

(56) References Cited

U.S. PATENT DOCUMENTS

| | | | | |
|---|---|---|---|---|
| 4,446,381 A | * | 5/1984 | Dalrymple | 327/143 |
| 6,118,315 A | * | 9/2000 | Guedj | 327/143 |
| 6,204,703 B1 | * | 3/2001 | Kwon | 327/143 |
| 6,882,570 B2 | * | 4/2005 | Byeon et al. | 365/185.18 |
| 7,015,732 B1 | * | 3/2006 | Holloway et al. | 327/143 |
| 2005/0275437 A1 | * | 12/2005 | Suzuki et al. | 327/143 |

FOREIGN PATENT DOCUMENTS

| JP | 2001-237684 A | 8/2001 |
|---|---|---|
| JP | 2006-5459 A | 1/2006 |

* cited by examiner

*Primary Examiner*—N. Drew Richards
*Assistant Examiner*—Patrick O'Neill
(74) *Attorney, Agent, or Firm*—Arent Fox LLP.

(57) ABSTRACT

This power detection circuit is comprised of a power-down detection circuit for detecting the first detection level and a power-on detection circuit having the second detection level higher than the first detection level, and the power detection circuit compulsorily initializes a power-on latch circuit by the output signal lowlevelx of the power-down detection circuit and also initializes the power-down detection circuit and the power-on detection circuit by the switch of a starter circuit.

13 Claims, 17 Drawing Sheets

POWER DETECTION CIRCUIT

CROSS-REFERENCE TO RELATED APPLICATIONS

This application is based upon and claims the benefit of priority from the prior Japanese Patent Application No. 2006-047548, filed on Feb. 23, 2006, the entire contents of which are incorporated herein by reference.

BACKGROUND OF THE INVENTION

1. Field of the Invention

The present invention relates to a power detection circuit, and more particularly to a power detection circuit for surely initializing the internal circuit of a power detection circuit and enabling the repetition operation of a starter circuit when is connected or disconnected while power is switched on (hot pluggable operation) in the power supply of a device for performing a connection/disconnection operation while power is switched (hot pluggable operation) which requires a circuit operation response.

2. Description of the Related Art

FIG. 1 shows the system configuration of the conventional power detection circuit.

The system comprises a power-on detection circuit 1 for detecting the power-on level of a power supply, a power-on latch circuit 2 for maintaining the state after detecting the power-on, a power-down detection circuit 3 for detecting the power-down level of the power supply by power drop after the power supply is started up, or the like, a power detection signal generation circuit 4 for receiving these signals and generating a power detection signal, and a starter circuit 5 for initializing the system when power is switched on.

First, when power is switched on, the starter circuit 5 outputs a signal nrset and the power voltage Vdd crosses the second potential and the power-on detection circuit 1 outputs a signal pwren and the power-on latch circuit 2 latches the power-on state. Then, when the power voltage Vdd crosses the second potential again, the power detection signal generation circuit 4 outputs a signal resetgo. Then, when power drops by $\Delta V$ (difference between the second and first potential, that is, hysteresis) after a signal starts up, the power-down detection circuit 3 outputs a signal resetctl, thereby resetting the power-on latch circuit 2.

In the above-described conventional circuit configuration, to respond to the connection or disconnection operation while power is switched on (hot pluggable operation), the power-on latch circuit 2 is initialized using a control signal based on the hysteresis operation from the power-down detection circuit 3 when the power-down is detected. However, since the control signal from the power-down detection circuit 3 is invalid when power is initially switched on, the balance between elements constituting the power-on latch circuit 2 or the like is broken to make the power-on latch circuit 2 enter into a desired state when power is switched on. Specifically, by changing the W/L of two elements constituting the power-on latch circuit 2, one of them is set high and the other is set low at an early stage.

Furthermore, even in the conventional circuit configuration, when power is switched on, it sometimes takes a significant amount of time to define the initial state of a node in the detection circuit by a power waveform. In order to cope with inconveniences, such as the fluctuation of a power detection level and the like, to define the initial state of the node, the starter circuit 5 is included. However, since starter circuit 5 is only activated when power is initially switched on, starter circuit 5 does not function when power is switched on secondly and after it is connected or disconnected while power is switched on (hot pluggable operation). Therefore, in this case, the power-on latch circuit 2 is not compulsorily initialized. As described above, this initialization performs a hysteresis operation by breaking the balance between elements constituting the power-on latch circuit 2.

In this case, since a control signal from the power-down detection circuit is invalid when the power is initially switched on, countermeasures to break the balance between devices constituting the latch circuit or so on are taken to put the latch circuit in a desired state when the power is switched on. However, the above-described countermeasures is not sufficient, depending on the start-up speed of the power supply, the latch circuit 2 is not sometimes initialized.

In order to break the balance between elements, it is necessary to change the W/L between both the elements. In this case, there is waste in the layout of devices and extra space is needed.

Furthermore, since there is a current path even when the power-on detection circuit 1 does not operate, power consumption is wasted.

The above-described conventional configuration is disclosed by patent reference 1.

In order to realize a more stable power-down detection level, the power-down detection circuit disclosed by patent reference 1 in the same form as the power-on detection circuit must be built in, there is a current path even when it does not operate. Therefore, power consumption is wasted. The power-down detection circuit disclosed by patent reference 1 dependently operates using the output of the power-on detection circuit as a trigger, and a hysteresis width sometimes changes.

Patent reference 1: Japanese Patent Application Publication No. 2006-5459 "Reset Circuit"

Patent reference 2: Japanese Patent Application Publication No. 2001-237684 "Power-on Reset Circuit"

The above-described prior art cannot define initialization since the initialization is performed using the hysteresis operation of the latch circuit. Therefore, the connection/disconnection (hot pluggable operation) cannot be stably performed. Furthermore, in order to realize a more stable detection level, the power-down detection circuit is not of a simple type performing the dependent operation of securing only a hysteresis width, as disclosed by patent reference 1. A detection circuit with an independent detection level is needed and the same circuit configuration as the power-on detection circuit must be introduced into a power-down detection circuit. Therefore, even when neither the power-on detection circuit nor the power-down detection circuit operates, there is a current path.

SUMMARY OF THE INVENTION

It is an object of the present invention to surely initialize an internal node in a current detection circuit, to stably connect/disconnect (hot pluggable operation) a power detection circuit while power is switched on, and further to suppress current consumption.

The power detection circuit of the present invention comprises a power-down detection circuit with a first power detection level and a power-on detection circuit with a second power detection level higher than the first power detection level. The power detection circuit compulsorily initializes a latch in the circuit in response to the detection signal (signal lowlevelx) of the power-down circuit. Thus, the latch in the circuit can be stably initialized.

The power detection circuit of the present invention comprises a means for cutting off a current path inside at least either of a power-on detection circuit and a power-down detection circuit. The cut-off means are controlled by a control signal (signal pondetz) generated by the power-on detection circuit. Thus, even when neither the power-on detection circuit nor the power-down detection circuit operate, power consumption can be suppressed.

The power detection circuit of the present invention comprises of a starter circuit. The starter circuit is comprised of a switch on its GND side. The power detection circuit at least initializes the power-down detection circuit and the power-on detection circuit controlling the switch. Thus, the circuit's latch can be surely initialized not only when power is switched on, but also when power-down is detected. Therefore, connection/disconnection while power is switched on (hot pluggable operation) can be stably performed.

According to the present invention, the latch circuit can be compulsorily reset not only when power is switched on again at the time of connection/disconnection (hot pluggable operation), but also when power is initially switched on, thereby contributing to the reliability improvement of a circuit operation. Since the starter circuit is indirectly under the control of a power-down signal, the starter circuit is initialized every time power is switched, thereby always contributing to the improvement of a circuit operation by a starter circuit.

By introducing a switch into the power-down detection circuit, control can be exerted over a current path existing in the power-on detection circuit and the power-down detection circuit only if each detection circuit is valid. This thereby contributes to the suppression of power consumption. Even when a power-down detection circuit not dependant on a power-on detection circuit is introduced to improve the accuracy of the power-down detection level, by introducing a switch, the accuracy of the power-down detection level can be improved by the same power consumption as the circuit configuration disclosed by patent reference 1.

Since the latch circuit is expected to initialize by itself when power is switched on, the balance between elements constituting the power-on latch circuit must be broken, et cetera. As a result, the size of a element constituting the latch circuit becomes relatively large. However, by the present invention, its initialization can be compulsorily performed externally. Thus the element can be restored to its ordinary size, thereby contributing to the size reduction of the latch circuit.

DESCRIPTION OF THE PREFERRED EMBODIMENTS

Figure 1:
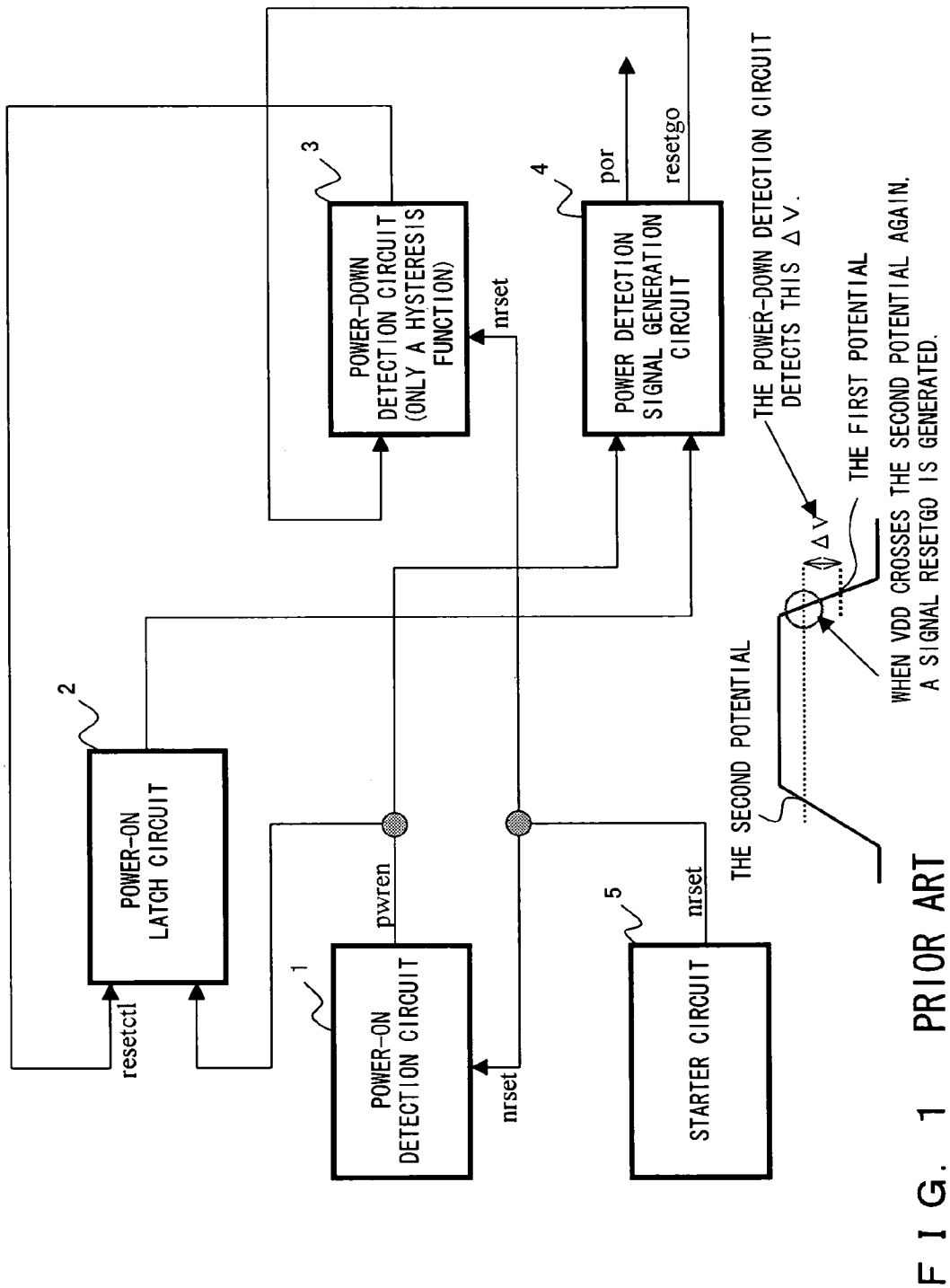
FIG. 1 shows the system configuration of the conventional power detection circuit.
Figure 2:
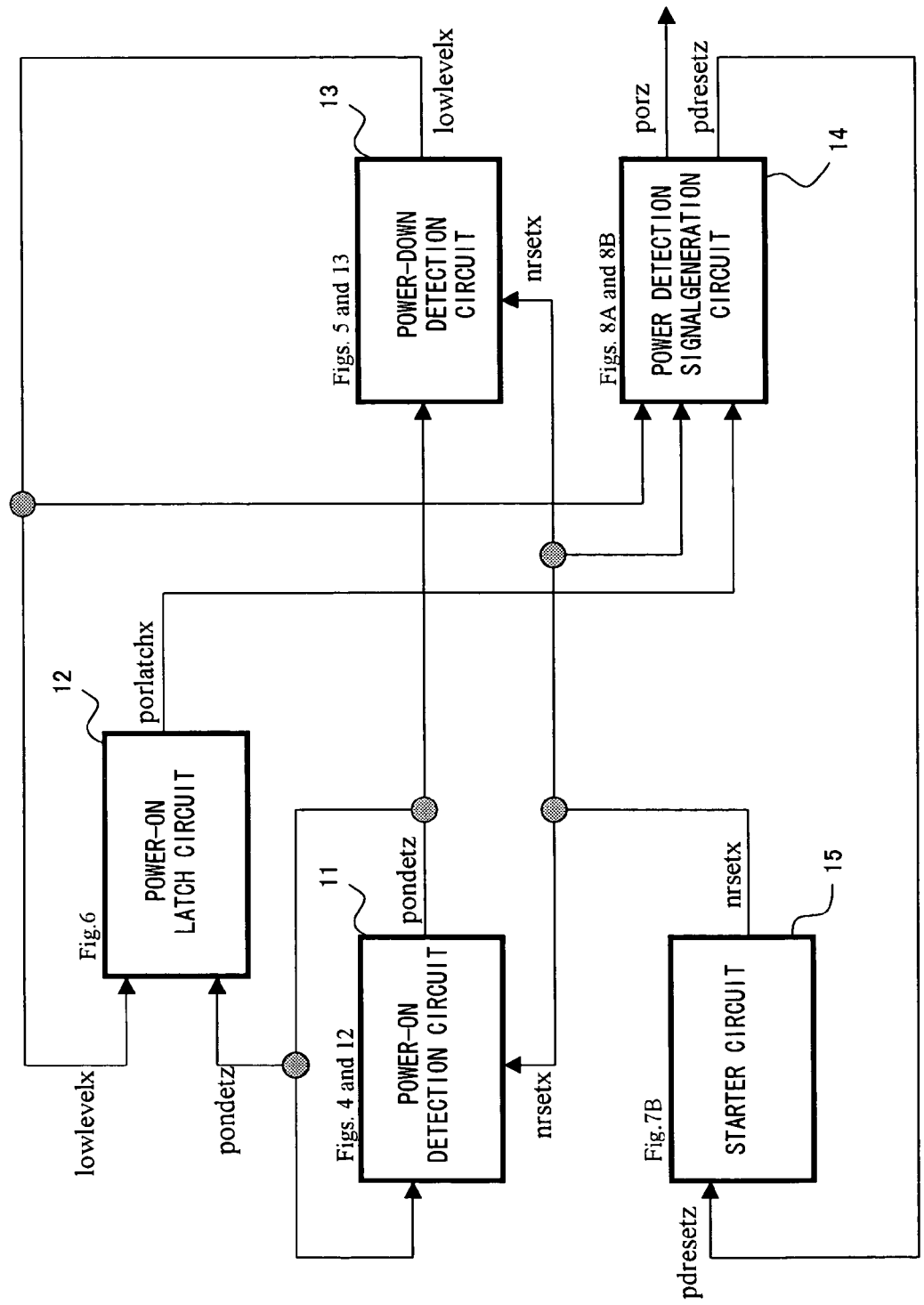
FIG. 2 shows the system configuration of the power detection circuit in one preferred embodiment of the present invention.

FIG. 2 shows the system configuration of the power detection circuit in one preferred embodiment of the present invention.

The system comprises a power-on detection circuit 11 for detecting the power-on level of a power supply, a power-on latch circuit 12 for maintaining the state after the power-on detection, a power-down detection circuit 13 for detecting the power-down level of the power supply by power drop or the like after the power supply is started up, a power detection signal generation circuit 14 for receiving these signals and generating a power detection signal, and a starter circuit 15 for initializing the system when power is switched on.

The power-down detection circuit 13 outputs a signal lowlevelx and initializes the power-on latch circuit 12, and also inputs the signal to the power detection signal generation circuit 14. The power detection signal generation circuit 14 receives the signal lowlevelx and outputs a signal pdresetz to control the switch of the starter circuit 15. Then, the starter circuit 15 controls a signal nrsetx to initialize the power-on detection circuit 11, the power-down detection circuit 13, and the power detection signal generation circuit 14. The power-on detection circuit 11 outputs a signal pondetz and controls the power-on detection circuit 11 and the power-down detection circuit 13 to open/shut the current path inside it, thereby suppressing power consumption. The signal pondetz, the output of the power-on detection circuit 11, puts the power-on latch circuit 12 in a set state. The power-on latch circuit 12 outputs a signal porlatchx indicating its set/reset state to the power detection signal generation circuit 14. The power detection signal generation circuit 14 externally outputs a signal porz indicating the state of the power detection circuit.

Figure 3:
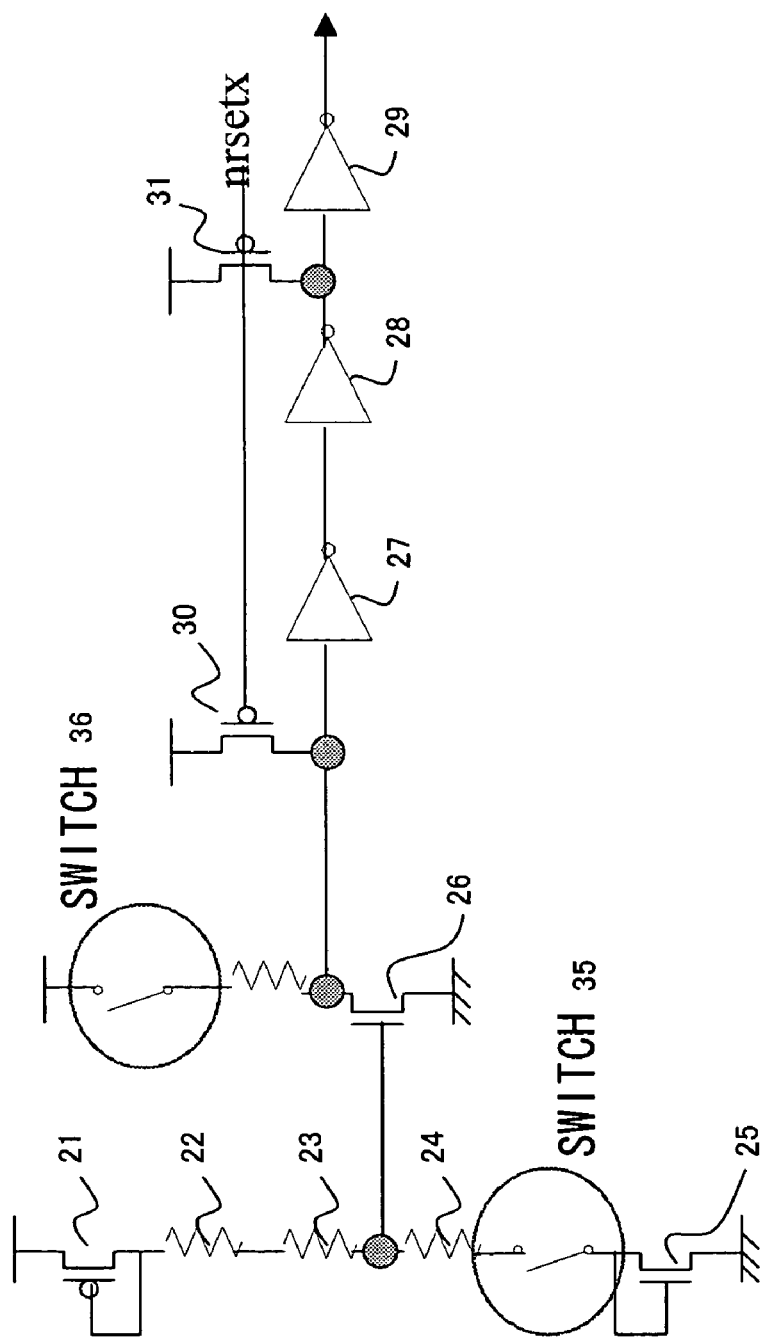
FIG. 3 is the circuit diagram of the detection circuit in one preferred embodiment.

FIG. 3 is the circuit diagram of the power-on or power-down detection circuit in one preferred embodiment. Firstly, when power is switched on, a current path is formed via a first P-ch transistor 21, three resistors 21, 22, and 23, and N-ch transistor 25. The P-ch transistor 21 and the N-ch transistor 25 are both diode-connected. Then, voltage divided from one terminal of resistor 23 is applied to the gate of the N-ch transistor 26 at a subsequent stage. When the N-ch transistor 26 is off and a signal nrsetx to be applied to the gates of the P-ch transistors 30 and 31 connected to inverters 27 and 29 is low, "high" is applied to the input of the first inverter 27 and the output of the detection circuit becomes low via inverters 28 and 29. When the N-ch transistor 26 is on and also the signal nrsetx is high, the P-ch transistors 30 and 31 become off and the output of an inverter composed of the N-ch transistor 26, whose gate receives the divided voltage of the power voltage, and a resistor between its drain side and the power supply is applied to the input of the inverter 27. Thus, a signal following the output of the inverter composed of the N-ch transistor 26, which receives the divided voltage from the power-on detection circuit and the resistor between its drain side and the power supply is outputted. When the signal nrsetx is high, a voltage corresponding to a split voltage by a split resistor is outputted. When the signal nrsetx is low, the detection circuit compulsorily outputs a low output since the P-ch transistors 30 and 31 are on.

By providing a first switch 35 and a second switch 36 between the resistor 24 and the N-ch transistor 25 and between the N-ch transistor 26 and the power supply, respectively, the current path is cut off when the power detection circuit does not operate.

Figure 4:
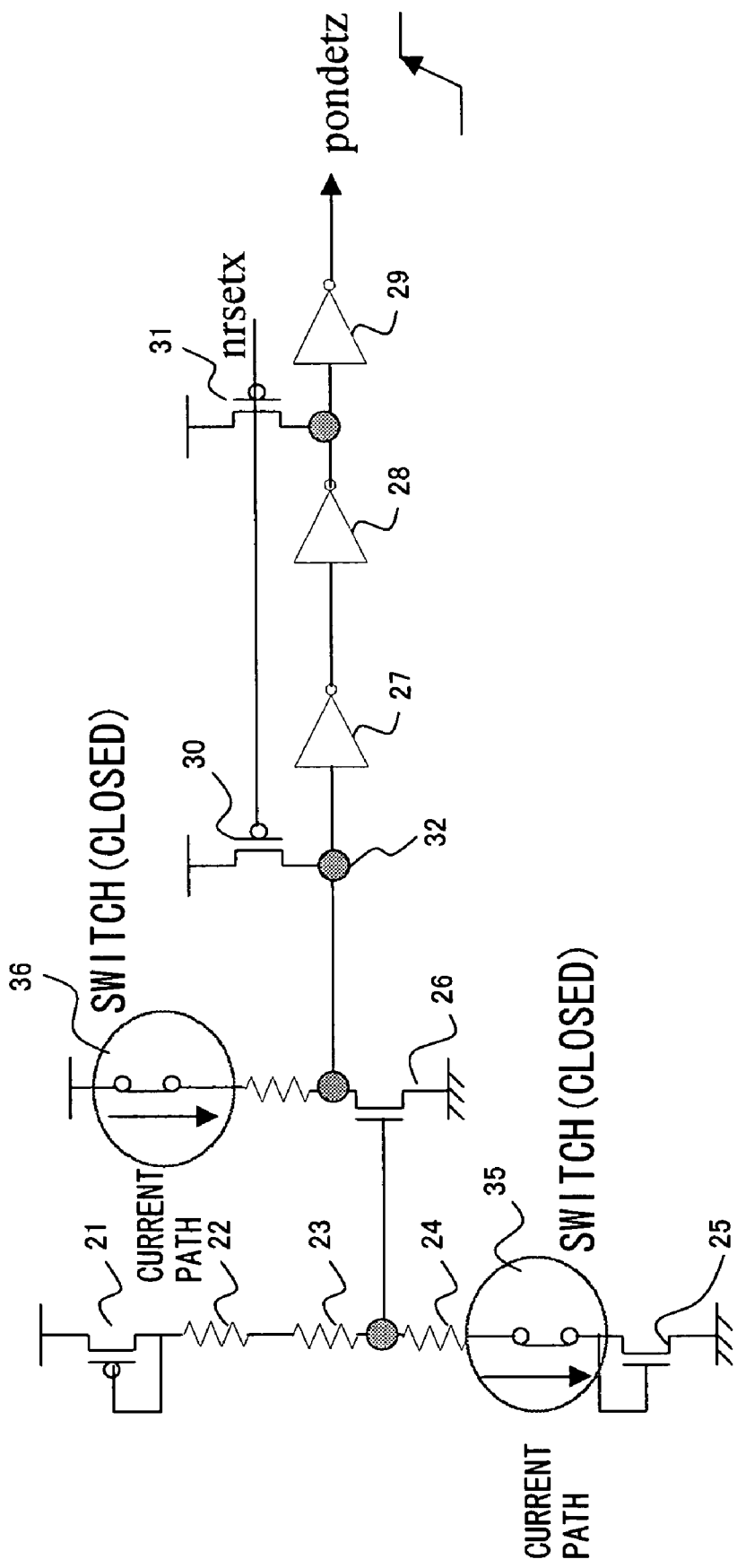
FIG. 4 is the circuit diagram of the power-on detection circuit in one preferred embodiment.

FIG. 4 shows the power-on detection circuit at the time of power switch-on.

When the signal nrsetx is low, the signal pondetz is also low. Even when the power voltage increases and the signal nrsetx increases, the signal pondetz remains low. In this case, when the power reaches a power-on detection level (the second potential), the power-on detection signal (signal pondetz) becomes high. Then, the switches 35 and 36, which receive the signal and are originally closed, are opened. Thus, the current path is cut off to suppress power consumption.

Figure 5:
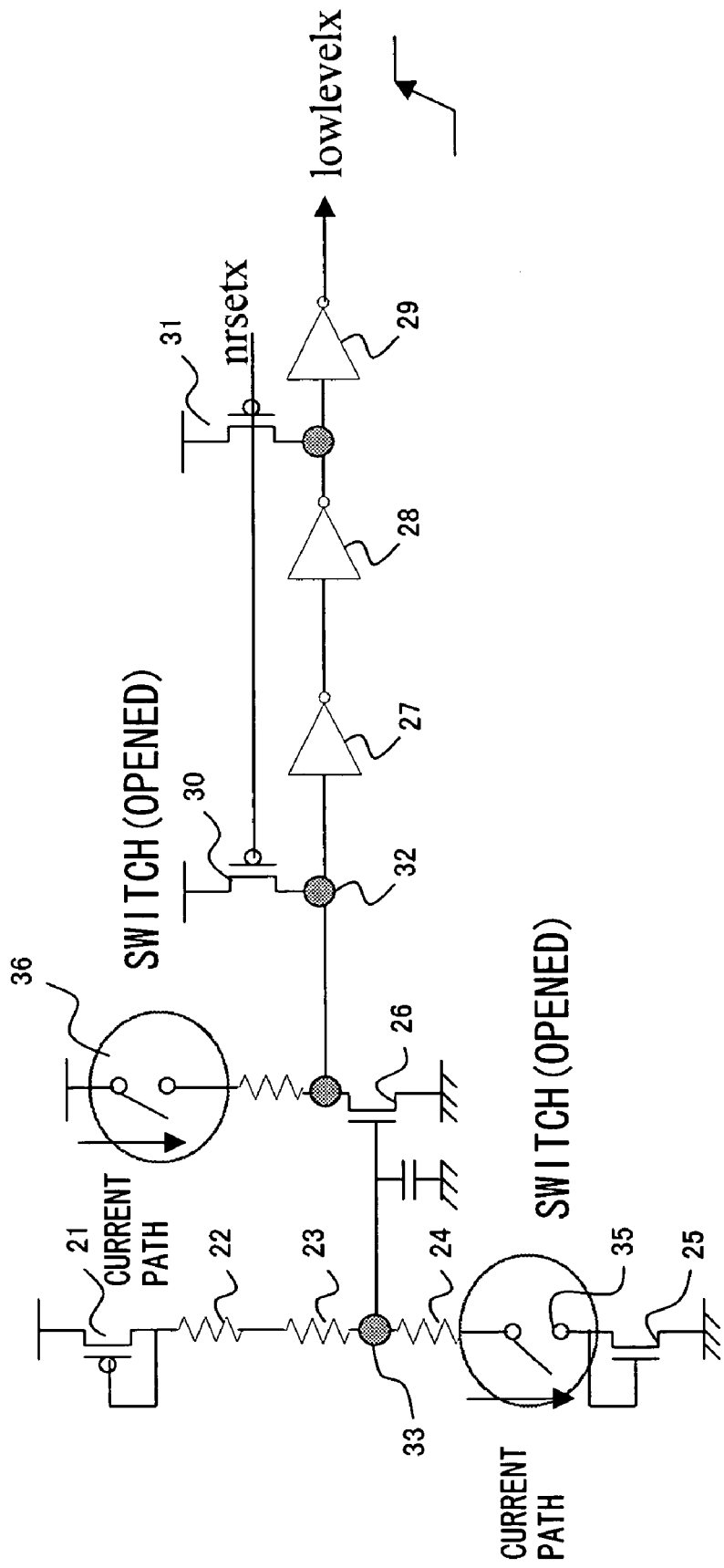
FIG. 5 is the circuit diagram of the power-down detection circuit in one preferred embodiment.
Figure 6:
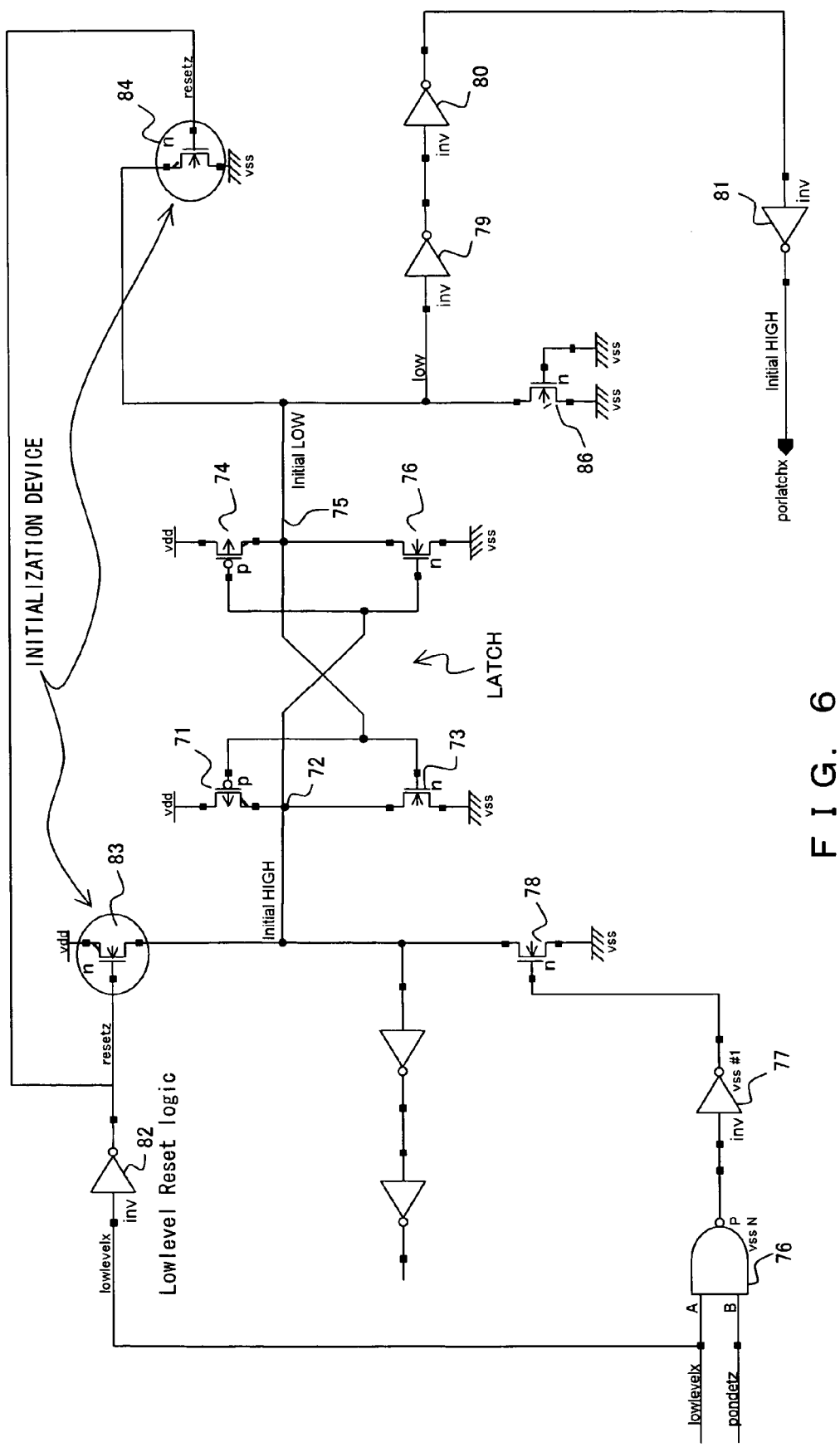
FIG. 6 is the circuit diagram of the power-on latch circuit in one preferred embodiment.

FIG. 5 shows the power-down detection circuit at the time of power switch-on. Different from FIG. 4, the switches are open. Therefore, when the level of a charger node 32 is higher than the threshold of the inverter 27 by the charge of P-ch transistors 30 and 31 controlled by the "low" of the signal nrsetx, the output (signal lowlevelx) of the power-down circuit becomes low. When the power increases and the signal nrsetx rises, the P-ch transistors 30 and 31 turn off. In this case, the voltage obtained by the resistor division also increases as the power increases and the N-ch transistor 26 is conducted. Then, charge is outputted from the node 32 to make the node 32 low. Thus, the signal lowlevelx rise up high toward the power level. Before the signal lowlevelx rises up high after power is switched on, a signal resetz obtained by inverting the signal lowlevelx becomes high in a logical level in the power-on latch circuit (FIG. 6). The signal resetz initializes the power-on latch circuit (FIG. 6). Since the power level does not increase sufficiently, the potential of the node increases as the power level rises. Thus, the latch is initialized when power is switched on.

The latch state can be surely initialized at the initial power switch-on by operating a reset device provided for the power-on latch circuit as the connection/disconnection (hot pluggable operation) counter-measures while power is switched on. This can be realized by adopting the output signal of the power-down detection circuit capable of realizing a detection level lower than that of the power-on detection circuit as a trigger. The power-down detection level is lower than the power-on level and can be detected at a low power level even when power is switched on. By using this detection signal as the initialization control signal of the power-on latch circuit 12, the power-on latch circuit 12 can be surely initialized. Furthermore, although a fairly ill-matched and large transistor constituting a latch was used so that the latch can be automatically initialized when power is switched on, an unnecessarily large transistor is not needed to slide the threshold since the initialization is compulsorily performed as described above, thereby reducing the layout size. When some time elapses after power is switched on, the signal nrsetx rises up to stop the starter circuit. Therefore, the P-ch transistors 30 and 31 are made off to stop the supply of charge.

Since in the power-down detection circuit 13 the switches 35 and 36 are open, the gate level of the N-ch transistor 26 rises as the power increases. As described above, when the gate level exceeds the threshold of the N-ch transistor 26, the charge of the node 32, charged by the P-ch transistor 30, is discharged. As a result, the output (signal lowlvelx) of the power-down detection circuit 13 transits from a low level to high one. When the power-on detection circuit 11 detects a desired power level, specifically the signal pondetz transits from low to high, these opened switches 35 and 36 are then closed and the power-down detection circuit 13 begins to function. This high level becomes the initial value of the power-down detection circuit 13 after the power-on.

Since in the first signal generation circuit of patent reference 2 a switch is not defined, the circuit continues to operate after power is switched on to form a current path.

However, in the present invention, since the power-down detection circuit stops until the power voltage reaches the second potential, there is no current path. This is because the power-down detection circuit is used only to generate a reset signal (lowlevelx→resetz) when power is switched on and no exact power-down potential level is required. Therefore, when power is switched on, charge supplied via the diode-connected P-ch transistor→the voltage-dividing resistor slowly stays in a node 33. When the potential of the node 33 reaches the threshold of the N-ch transistor receiving it, lowlevelx, the output of the power-down detection circuit, transits from high to low to release the reset signal.

Figure 7A:
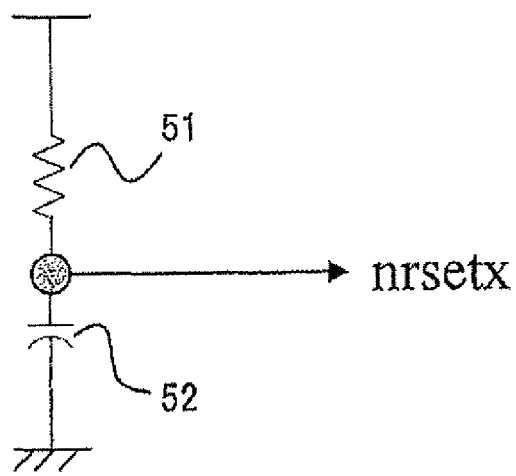
FIG. 7A shows the conventional starter circuit.
Figure 7B:
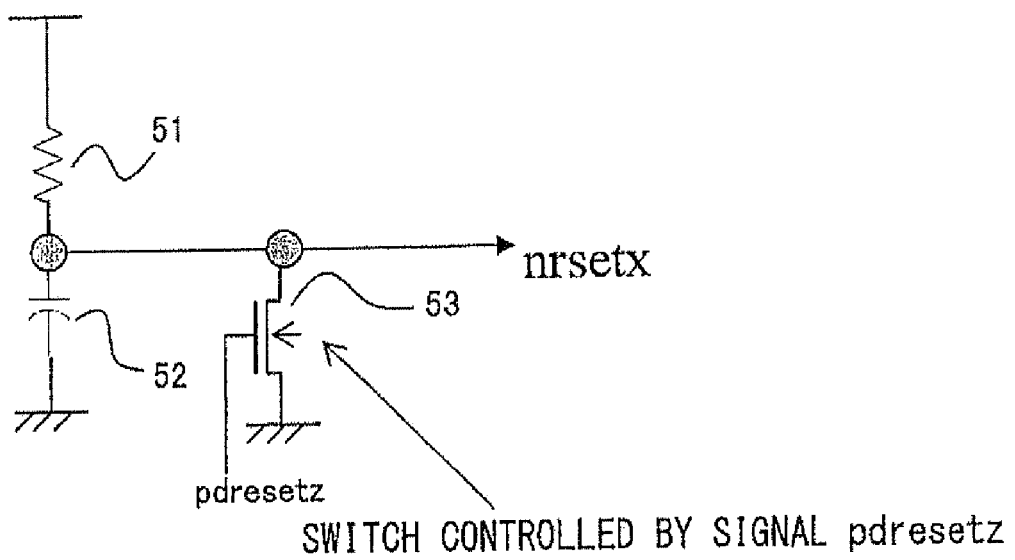
FIG. 7B shows the starter circuit in one preferred embodiment of the present invention.

FIGS. 7A and 7B show the starter circuit of the power supply. FIG. 7A shows an example of the old starter circuit in which an output signal nrsetx is transmitted from the terminal of an RC circuit composed of a resistor 51 connected to the power supply and a capacitor 52, and the signal nrsetx rises according to an RC time constant as the power voltage increases.

FIG. 7B shows the starter circuit of the present invention, in the RC output terminal of which a switch 53 is provided. This switch 53 is controlled by the output signal pdrestz of the power detection signal generation circuit 14 and compulsorily sets this signal at zero when the signal nrsetx varies according to the RC time constant.

The starter circuit shown in FIG. 7B can be operated by resetting it every time power is switched on. Although the best timing for initializing the circuit is when power is switched on again, in that case, a signal for initializing the starter circuit itself must be separately prepared, which is not practical. Since the power voltage is low immediately after power is switched on, there is a fear that the driving capability of a transistor may be small.

The power-down detection circuit 13 controls the reset operation of the latch circuit 12. Since the resetting of the latch circuit 12 is the same as performed when the supply is initialized, there is no problem in resetting the starter circuit in the same timing. However, since the output signal (signal lowlevelx) of the power-down detection circuit 13 also changes when the power supply is started up, the same signal cannot be used to initialize the starter circuit 15 without any modifications. Therefore, the starter circuit 15 is controlled and initialized after the signal is logically operated with the output signal porlatchx of the power-on latch circuit 12, whose state does not transit until the power-on detection circuit 11 detects a detection level. Specifically, as shown in the power-down initialization circuit of the power detection signal generation circuit in FIG. 8B, the switch 53 is turned on by logically operating between the signals lowlevelx and porlatchx, and outputting a signal pdresetz, as shown in FIG. 7B.

Figure 9:
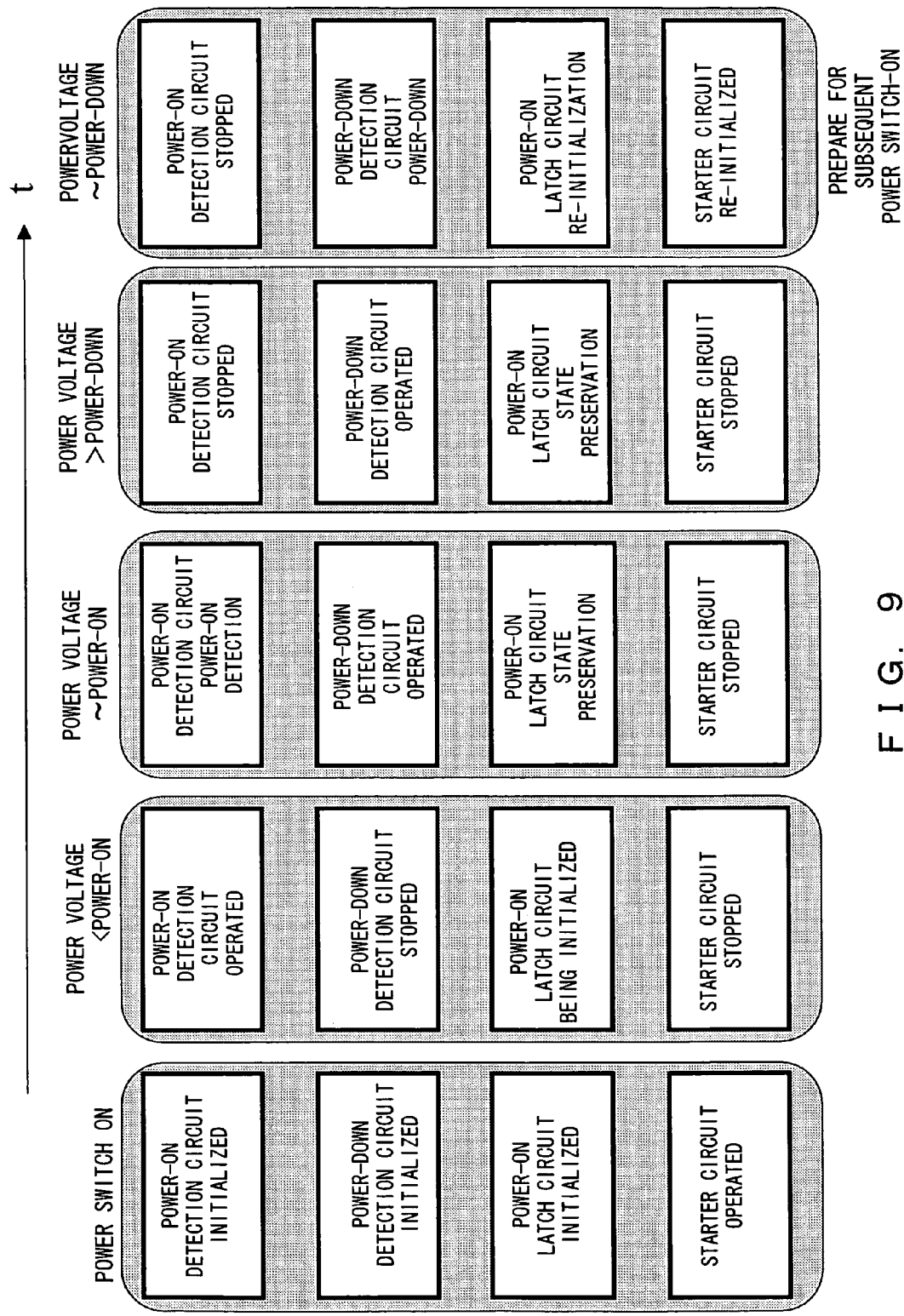
FIG. 9 shows the operational flow of the power detection circuit and the state of each circuit of the present invention.

FIG. 9 shows a series of flow from power switch-on to the power-down, together with the state transition of each circuit.

The operational flow of the present invention and the transition of each circuit state are described below with reference to FIG. 9.

(1) Power Switch-on

Firstly, the power-on detection circuit is initialized, and simultaneously the power-down detection circuit and the power-on latch circuit are also initialized. Then, the starter circuit continues to operate.

(2) Power Voltage <Power-on

The power-on detection circuit is in operation and the power-down detection circuit stops. The power-on latch circuit is being initialized and the starter circuit stops.

(3) Power Voltage~Power-on

Power-on is detected and the power-down detection circuit is in operation. The power-on latch circuit maintains the set state and the starter circuit stops.

(4) Power Voltage>Power-Down

The power-on detection circuit stops and the power-down detection circuit is in operation. The power-on latch circuit maintains the set state and the starter circuit stops.

(5) Power Voltage~Power-Down

The power-on detection circuit stops and the power-down detection circuit detects power-down. The power-on latch circuit and the starter circuit initialize again.

The power-on latch circuit 12 shown in FIG. 6 comprises of a flip-flop circuit in which a P-ch transistor 71 connected to Vdd is connected to the earth via a first terminal 72 and a N-ch transistor 73 and similarly a P-ch transistor 74 connected to Vdd is connected to the earth via a second terminal 75 and an N-ch transistor 76.

A setting circuit is formed by the NAND 76, an inverter 77, and an N-ch transistor 78. One terminal of the N-ch transistor is connected to the first terminal 72. A state output circuit is formed by three stages of inverters 79, 80, and 81, and is connected to the second terminal 75. The output (resetz) of an inverter 82, to which the signal lowlevelx is inputted, is connected to N-ch transistors 83 and 84. The N-ch transistors 83 and 84 are connected to the first and second terminals 72 and 75, respectively, to initialize the latch circuit. A N-ch transistor 86 is diode-connected in order to keep its balance with the N-ch transistor 78.

If the output (lowlevelx) of the power-down detection circuit 13 is low, the signal resetz becomes high, enters the N-ch transistors 83 and 84, and makes the first and second terminal sides low and high, respectively, to reset (initialize) the latch circuit.

The "high" of the signal lowlevelx and the "high" of the output (pondetz) of the power-on detection circuit 11 switches on the N-ch transistor 78 via the NAND 76 and the inverter 77 to make the first terminal low and to switch off the N-ch transistor 76 of the second terminal. When the second terminal becomes high, the N-ch transistor 73 on the first terminal side is conducted to make the first terminal 72 low. Thus, the first and second terminals are made low and high, respectively, to stably latch the set state. The "high" of the second terminal outputs a low output (porlatchx) via three stages of inverters.

Figure 8A:
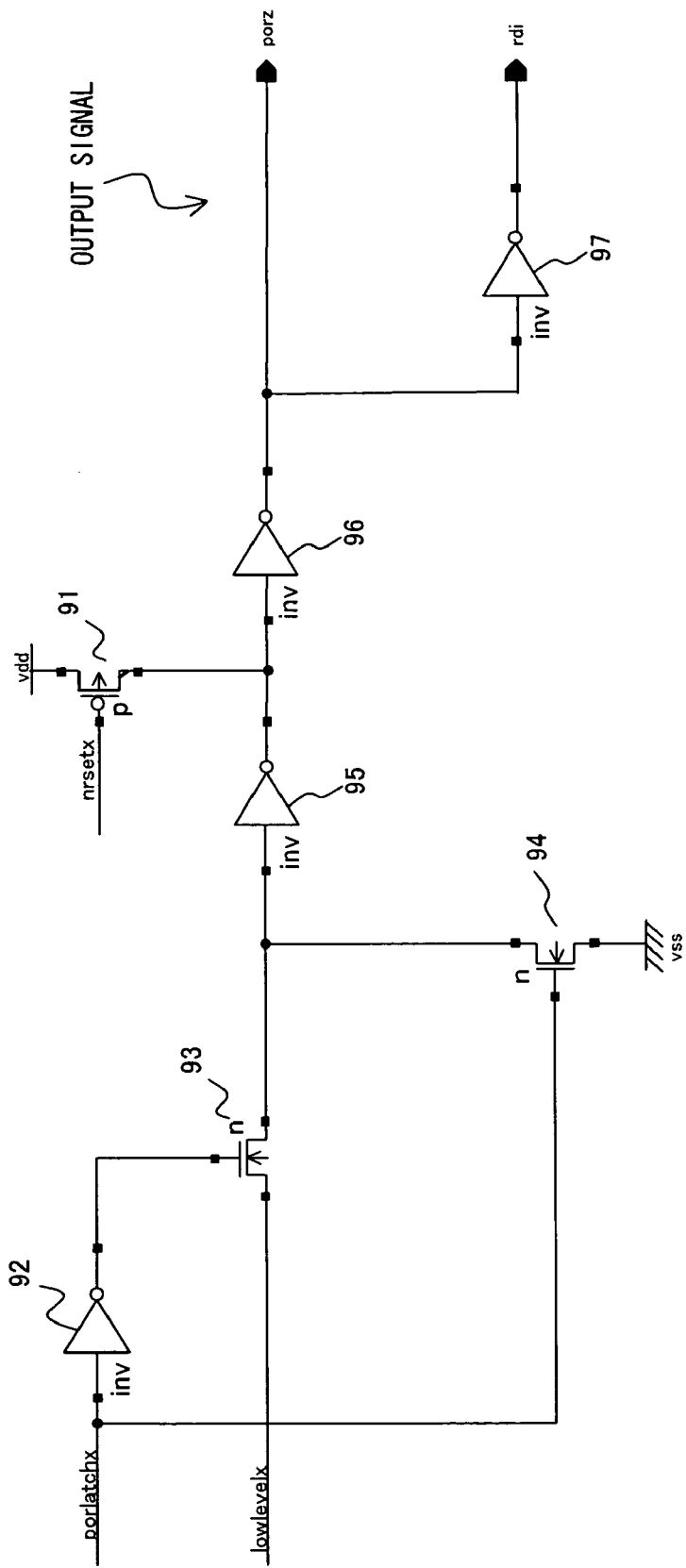
FIG. 8A is the circuit diagram of the power-on reset circuit of the power signal generation circuit.

FIG. 8A is the circuit diagram of the power-on reset circuit of the power detection signal generation circuit. Before power is switched on or the power detection signal generation circuit is reset, the output (nrsetx) of the starter circuit is low. Then, the output of a P-ch transistor 91 becomes high and its output signal (porz) surely becomes low. When the power-on latch circuit is reset and the signal porlatchx is high, the input of an inverter 95 becomes low and the output signal (porz) remains low. If the power-on latch circuit is set and signal porlatchx becomes low, a path transistor 93 is switched on and the "high" of the signal lowlevelx is outputted to make the output signal (porz) high. Thus, the set state of the power-on latch circuit is outputted by the output signal (porz).

Figure 8B:
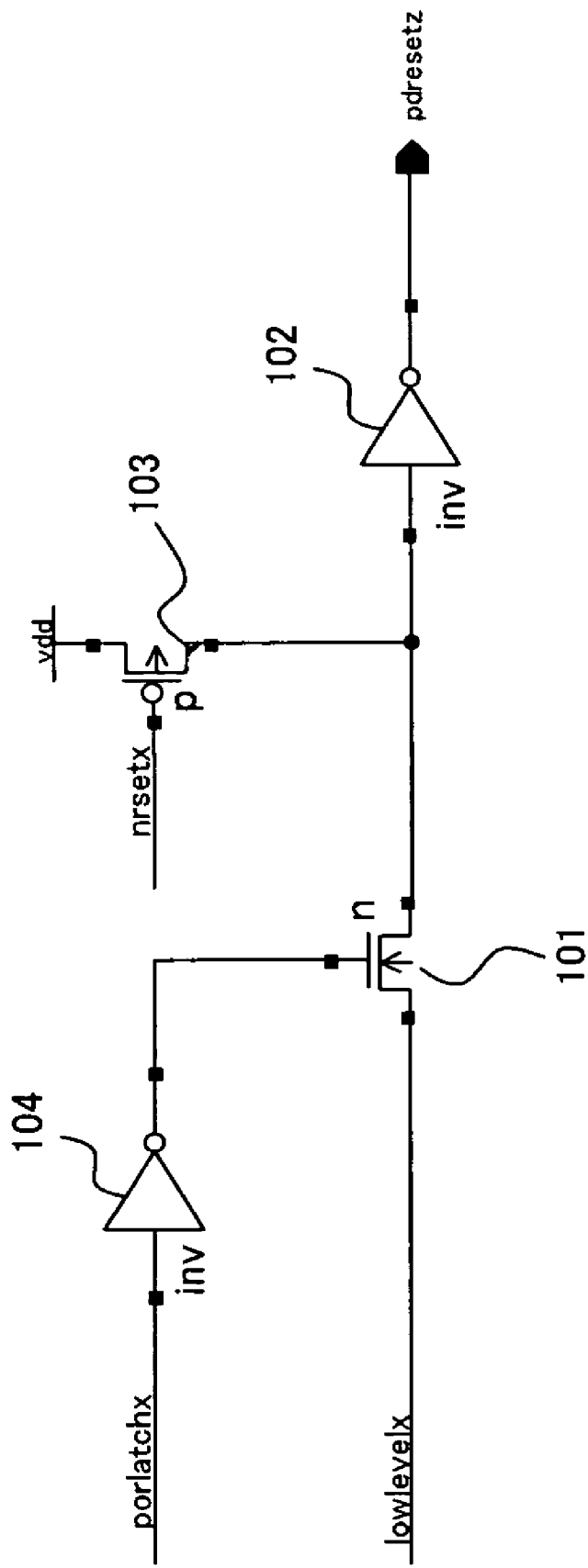
FIG. 8B is the circuit diagram of the power-down reset circuit of the power signal generation circuit.

FIG. 8B is the circuit diagram of the power-down reset circuit of the power detection signal generation circuit.

When the power-on reset latch signal porlatchx of the latch circuit 12 is low, specifically, the latch circuit 12 is set, a N-ch path transistor 101 is switched on, and the "low" of the output (lowlevelx) of the power-down detection circuit 13 is inverted by an inverter 102 to output the "high" of the output (pdresetz). This initializes the starter circuit (FIG. 7B) at the time of power-down. If the signal pdrestz outputs "high", the starter circuit switch is turned on and the signal nrsetx becomes low. Then, the P-ch transistor 103 of the power-down reset circuit (FIG. 8B) is switched on and the output signal (pondetz) becomes low again. Thus, the signal pondez temporarily becomes high to form a pulse signal that subsequently becomes low. When the signal porlatchx is high, specifically the power-on latch circuit 12 is reset, the signal lowlevelx is not outputted.

Figure 10A:
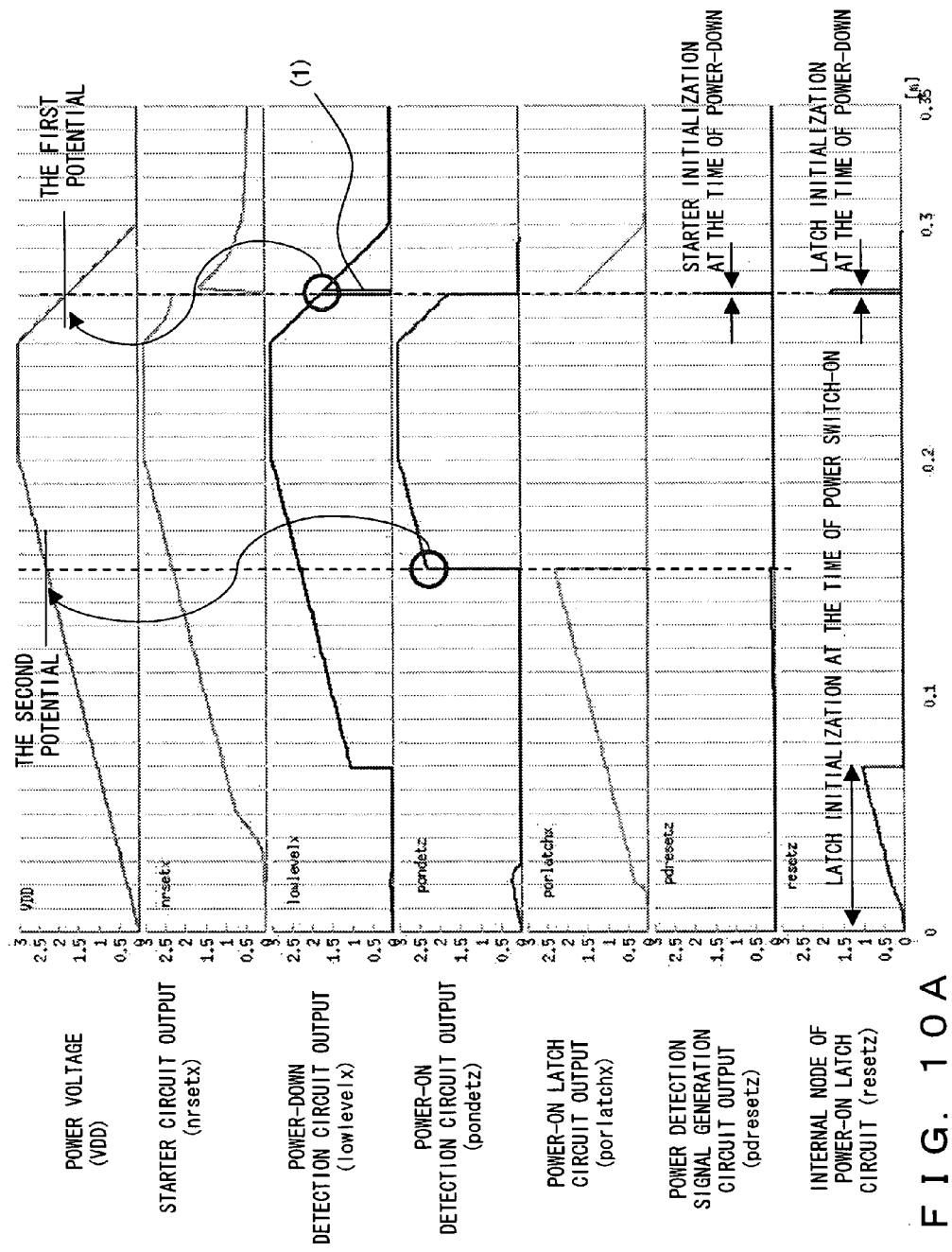
FIG. 10A is a timing chart showing the operation of the signal of each component of the power detection circuit of the present invention (No. 1)

FIG. 10A shows the signal waveform of one preferred embodiment of the present invention.

When power is applied (t=0), charge is inputted from the power supply to nodes to be first initialized in three circuits (power-on detection circuit 12, power-down detection circuit 13, and power detection signal generation circuit 14) via the P-ch transistor 31 controlled by the "low" of the output (nrsetx) of the starter circuit to define the initial potential of the nodes. As a result, the outputs of the three circuits are defined at an early stage of the start-up of the power supply.

One of circuits to be initialized when power is applied is the latch circuit (the power-on latch circuit 12). Conventionally, although the latch circuit 12 is self-concludedly initialized by adjusting the combination of the thresholds of elements constituting the latch circuit, sometimes the initialization of a latch lacks reliability since the initialization of the latch circuit 12 depends on the start-up speed of the power supply. Therefore, in this preferred embodiment, the latch circuit 12 is initialized by compulsorily controlling it externally. This initialization is performed by a signal reretz, using a device for initialization (inverter 82) via the N-ch transistors 83 and 84 controlled by the signal resetz shown in FIG. 6. The signal resetz's control signal is obtained by logically inverting the signal lowlevelx, the output of the power-down detection circuit 13. When power is switched on, the output (lowlevelx) of the power-down detection circuit 13 becomes low. In FIG. 5, the charge of node 32, charged by the P-ch transistors 30 and 31 controlled by the output (nrsetx) of the starter circuit, is discharged via the N-ch transistor 26 whose drain is connected to the node 32. When the potential of node 32 drops behind the threshold of the inverter 27 at a subsequent stage, the signal lowlevelx transits from low to high. Vdd slowly charges the gate of the N-ch transistor 26 from which charge is to be discharged via the diode-connected P-ch transistor 21 and resistors 22 and 23, and when the gate potential reaches the threshold, the discharge of its charge is started.

While this signal lowlevelx is low, the initial value of the latch circuit 12 is a value by which the signal porlatchx is expected to be made high at an early stage when the initialization device of the latch circuit 12 operates. Therefore, the latch is defined at the power voltage sufficiently lower than the first detection level of the power supply. Even while the signal resetz, a signal resetting the latch, is high, the initialization of the latch is completed and defined in a sufficiently short time.

When the power voltage continues to increase (or the power voltage is constant for a sufficient time), the terminal voltage of the starter circuit's capacitor is charged (FIG. 7B), that is, the output voltage (nrsetx) exceeds the thresholds of the P-ch transistors 30 and 31. Therefore, the P-ch transistors 30 and 31 charging each node stop and the potential of the capacitor of the starter circuit also follow the power voltage (t~0.05).

When the power voltage continues to further increase, it reaches the neighborhood of the first potential and the power-down detection circuit is initialized (the expected initial value is high).

When the power voltage reaches the second potential, the output pondetz of the power-on detection circuit transits from low to high (t~0.15). Then, the state of the power-on latch circuit receiving this signal transits from reset to set and the output (porlatchx) of the power-on latch circuit transits from high to low. In FIG. 6, the control signal of the power-on latch circuit is not simply the signal pondetz of the power-on detection circuit but is obtained by logically operating between the signal pondetz and the signal lowlevelx of the power-down detection circuit in the NAND 76. However, this is because power is prevented from being wrongly detected at a low power voltage since there is a possibility that an inverter inverts due to noise and the potential of the node to make the signal high (essentially should be low). The stability of the power-on latch circuit is remarkably improved by adding a new function to compulsorily initialize externally the power-on latch circuit, which is unstable when the power voltage at the time of power switch-on is low, and also providing low-voltage protection (logical process of a signal pondetz and a signal lowlevelx) in order to prevent mis-operation at the time of low voltage as to detect power on the power-on side.

If the power voltage drops down to the first potential after it starts dropping, the output (lowlevelx) of the power-down detection circuit transits from high to low. Then the node inside the power-on latch circuit transits from low to high to initialize the latch. As a result, the output (porlatchx) of the latch circuit transits from low to high and is initialized.

In the power-on reset circuit of the power detection signal generation circuit 14 (FIG. 8A), when the signal porlatchx is high, as shown in (1), the input signal lowlevelx transits from high to low and then, the signal lowlevelx transits from low to high. Therefore, an N-ch transistor 94 controlled by the signal porlatchx is switched on and the input of an inverter 95 at a subsequent stage is suppressed low. Therefore, the signal porz, the output of the power detection signal generation circuit, transits from high to low (see FIG. 10B). As the signal (pdresetz) used to control the initialization (discharge of capacitor charge) of the starter circuit, a signal obtained by logically operating between the signals porlatchx and lowlevelx in the power-down resetting circuit (FIG. 8B) is used. Specifically, when the state of the power-on latch circuit is set, the signal porlatchx becomes low and the output of the inverter 104 becomes high, and the signal lowlevelx is passed in the N-ch transistor 101. The moment the signal lowlevelx becomes low as shown in (1), the "high" of the signal pdresetz is outputted.

In FIG. 10A, the features of the present invention can be summarized as follows.

As the power voltage increases, the output (nrsetx) of the starter circuit 15, the output (porlatchx) of the latch circuit 12, and the internal node (resetz) of the latch circuit also increase. When the power voltage Vdd increase to the first potential and in the power-down detection circuit, the signal nrsetx turns off the P-ch transistors 30 and 31, and the signal lowlevelx rises up high. At this moment, the signal resetz of the internal node becomes low. In this case, the initialization at the time of power switch-on is completed before the signal resetz of the internal node becomes low after power is switched on. At this point, since the power voltage is low, the operation is analog. However, it can be logically described as follows. At this moment in the latch circuit, since the signal resetz of the internal node is obtained by inverting the signal lowlevelx, the N-ch transistor 83 shown in FIG. 6 is conducted. In other words, since the signal resetz is high while the signal lowlevelx is low, as shown in FIG. 10A, the N-ch transistor 83 is conducted and the latch circuit is initialized, that is, reset. Thus, the signal resetz of the internal node of the latch circuit is generated using the output signal lowlevelx of the power-down detection circuit; the power-on latch circuit can be compulsorily initialized when power is switched on.

When the power voltage decreases and reaches the first potential, the output signal lowlevelx of the power-down detection circuit (FIG. 5) becomes low (FIG. 10A). At this moment, in the power-down reset circuit of the power detection signal generation circuit (FIG. 8B), the low signal lowlevelx is applied to the input of the inverter 102 to make the signal pdresetz temporarily high. Thus, the signal nresetx is made low by the operation of the starter circuit (FIG. 7B). Then, the P-ch transistor 103 of the power-down reset circuit (FIG. 8B) is switched on again to restore the signal pdresetz low.

The above operation is described in more detail below. When the power voltage decreases, potential based on the split voltage of the power-down detection circuit (FIG. 5) drops. However, since it does not reach the threshold of the N-ch transistor 26, the output is logically maintained high. Thus, the output of the low signal lowlevelx is logically maintained high via three inverters 27, 28, and 29, and the potential follows the power voltage drop. The N-ch transistor 26 detects and switches off that the power voltage has dropped to the first potential. The power voltage is supplied from a switch 36, which is closed when it is set, to the node 32 and the input of the inverter 27 becomes high. Therefore, the signal lowlevelx temporarily falls low. When the signal lowlevelx falls, in the power-down reset circuit (FIG. 8B), since the signal porlatchx is still low, the "low" of this signal lowlevelx becomes high via an N-ch pass transistor 101 and an inverter 102 to make the signal pdresetz temporarily high. Since this high level turns on the switch of the starter circuit (FIG. 7B) to make the signal nrsetx low, the signal pdresetz falls low again. When the signal lowlevelx becomes low, in the power-on latch circuit (FIG. 6), the signal resetz becomes high and the N-ch transistor 83 is conducted. Therefore, the power-on latch circuit returns to a reset state. This is the initialization of a latch at the time of power-down. Furthermore, when the signal pdresetz is high, the starter circuit is also initialized and the fact that the low signal nrsetx is applied to the power-on detection circuit, the power-down detection circuit, and the power detection signal generation circuit to initialize them.

In the present invention, as described above, by making the signal lowlevelx pulsewise low when reset, all circuits including the latch circuit in the power detection circuit can be initialized at an early stage. Thus, even when the connection/disconnection operation is fast, it can be coped with.

Figure 10B:
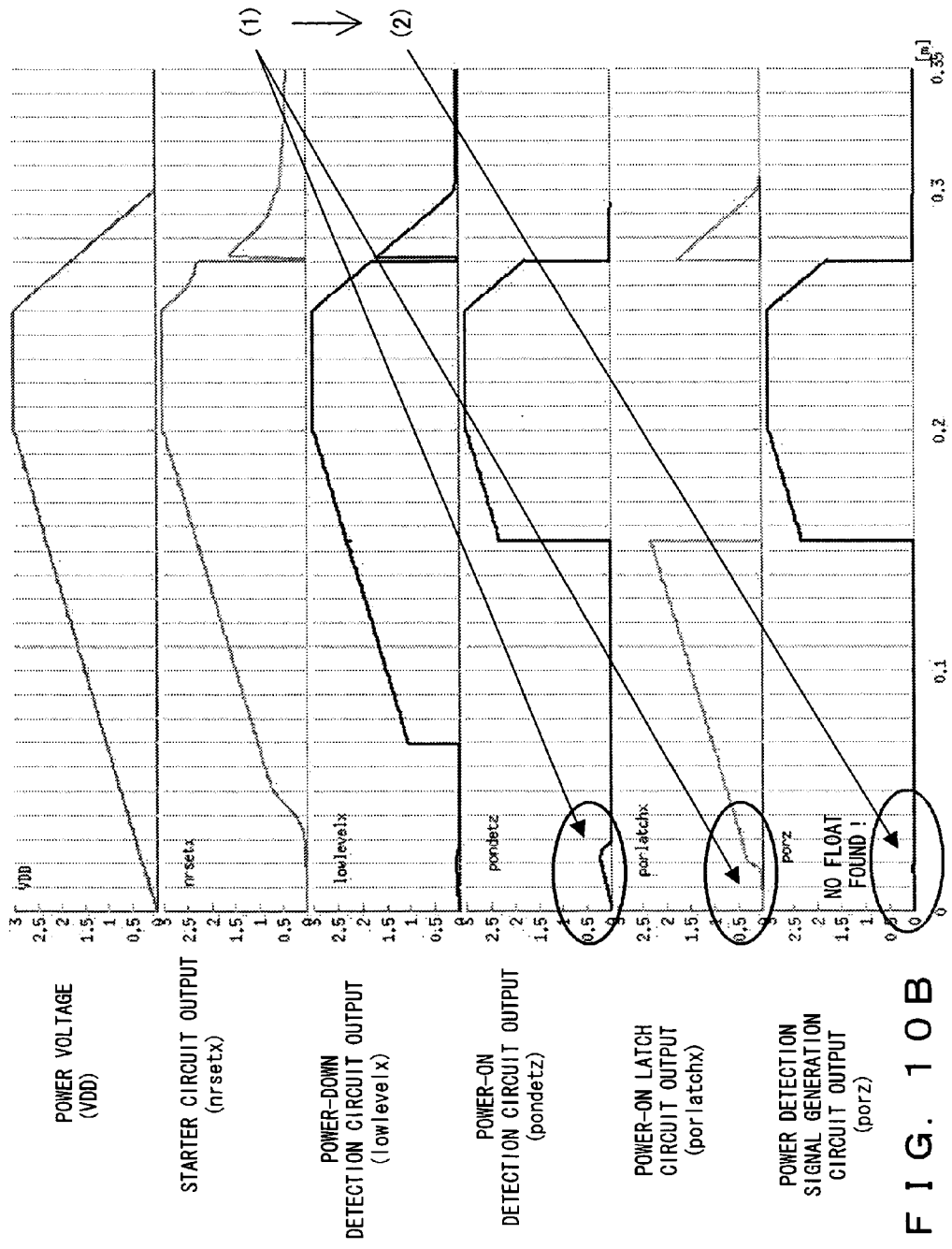
FIG. 10B is a timing chart showing the operation of the signal of each component of the power detection circuit of the present invention (No. 2)

Next, the operation is described with reference to FIG. 10B.

As shown in (1), the output signal pondetz of the power-on detection circuit (FIG. 4) and the output signal porlatchx of the power-on latch circuit (FIG. 6) become unstable before the latch circuit is initialized (porlatchx is logically high) after power is switched on. Therefore, when the output of the latch circuit is made the output of the power detection circuit without any modifications, a mis-operation occurs. In this case, not only the output of the power-on latch circuit becomes unstable, but also the output of the power-on detection circuit becomes unstable.

Then, the output porz of the power detection signal generation circuit is obtained by inverting the porlatchx of the power-on latch circuit. As shown in (2), in the power detection signal generation circuit, the output of the power-on latch circuit is not outputted to the output as it is, the operation is stabilized when power is switched on. The output and the output of the power-down detection circuit are logically operated and its output is used as the output of the power detection circuit. Furthermore, since the node state at the time of power switch-on is defined at an early stage, the node is initialized by the signal nrsetx controlled by the starter circuit. Thus, no float can be found in the output signal porz.

The above description can be summarized as follows. The latch circuit is compulsorily initialized by the power-down detection output (signal lowlevelx) of the power-down detection circuit at the respective time of power switch-on and power-down.

Figure 11:
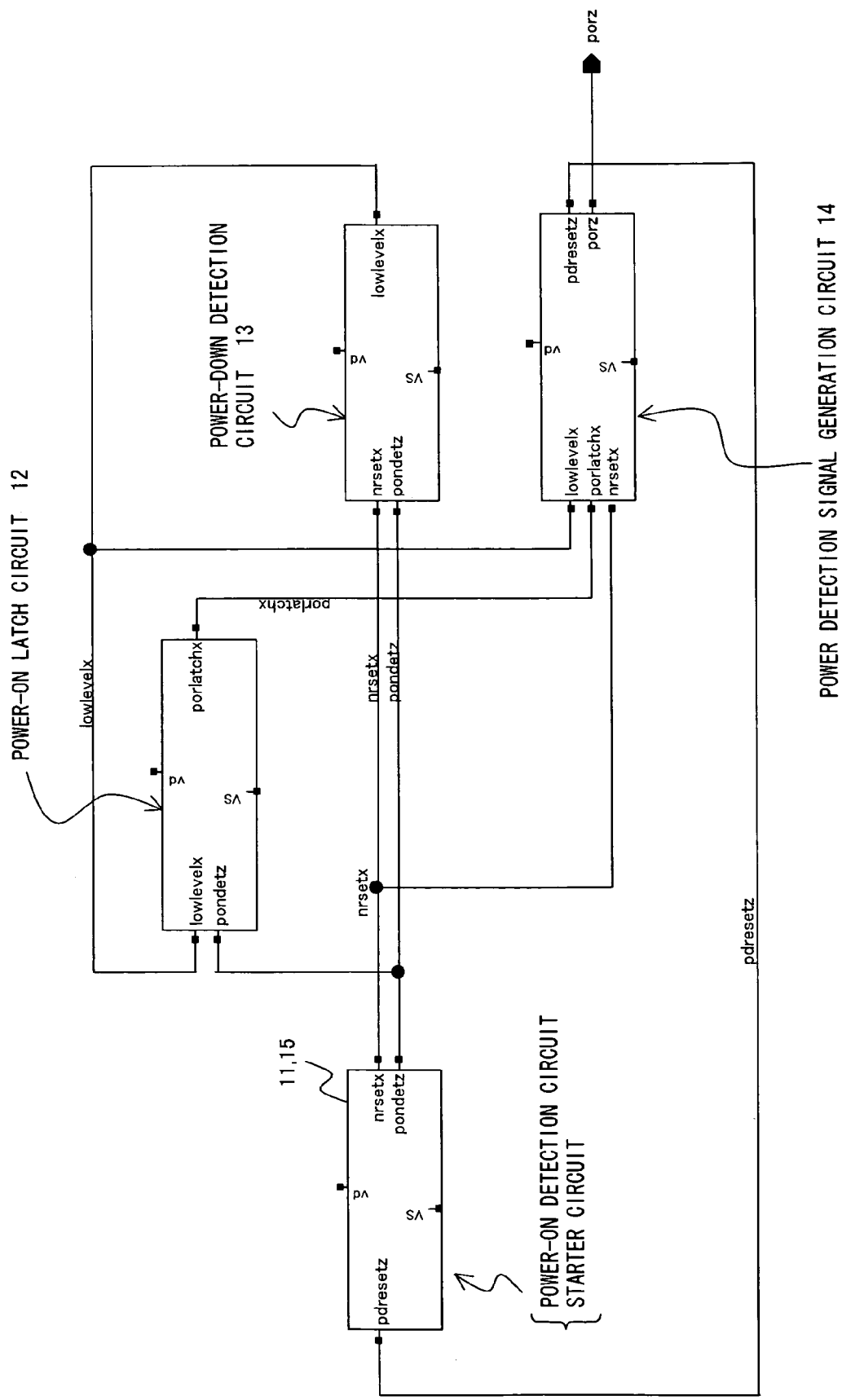
FIG. 11 is the block diagram of the power detection circuit of the present invention.

FIG. 11 is a block diagram showing the system configuration of the present invention shown in FIG. 2 in another way. However, the power-on detection circuit 11 and the starter circuit 15 are shown in the same block.

Figure 12:
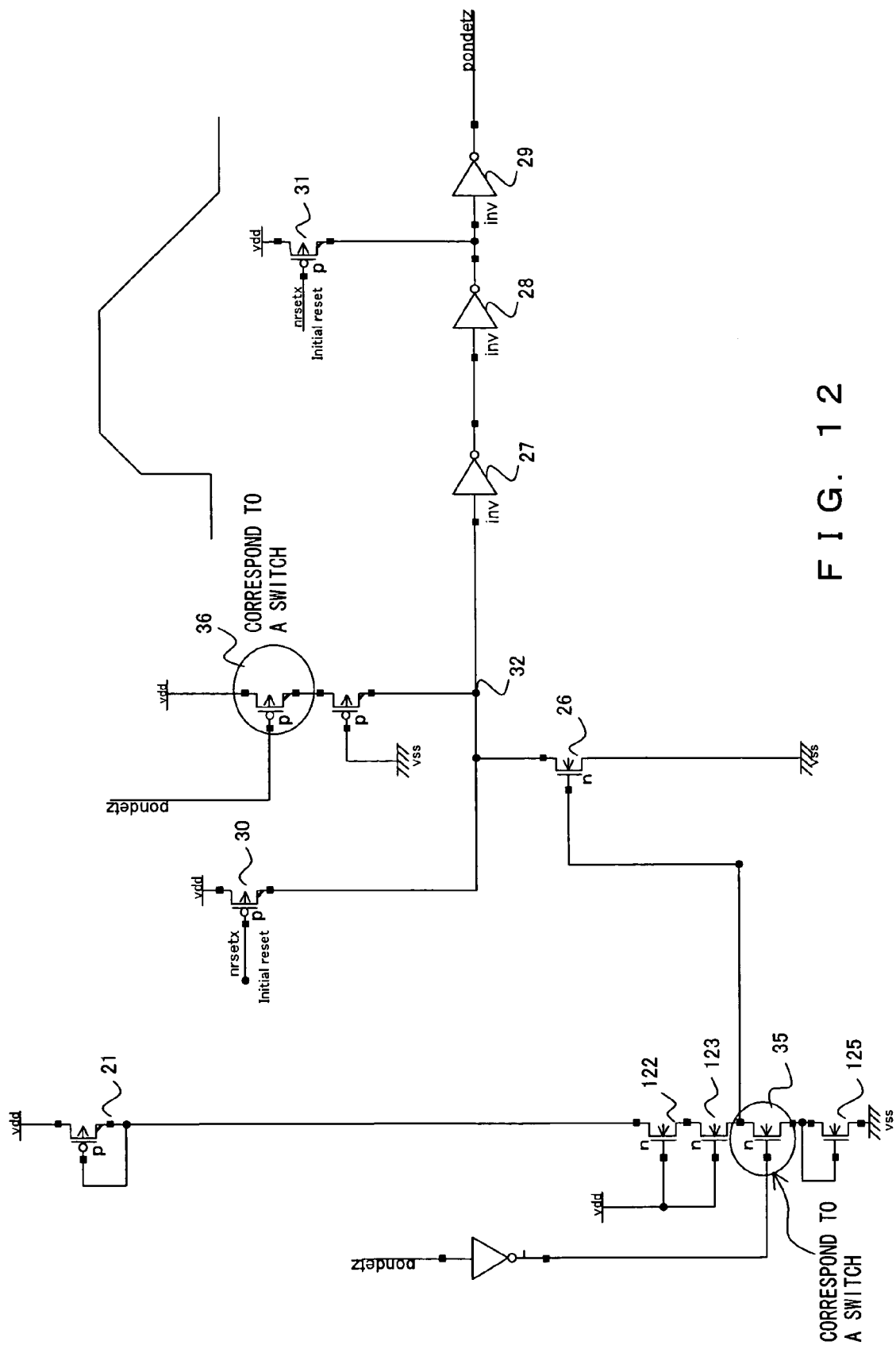
FIG. 12 is the detailed circuit diagram in one preferred embodiment of the power-on detection circuit.

FIG. 12 is the detailed circuit diagram of the power-on detection circuit shown in FIG. 4. In FIG. 12, a voltage-dividing resistor is composed of transistors 122, 123, and 125. The output signal (nrsetx) from the starter circuit is connected to the gate of each of the P-ch transistor circuits 30 and 31. A P-ch transistor 36 to the gate the signal pondetz is applied and an N-ch transistor 35 to the gate a signal obtained by inverting the signal pondetz is applied correspond to the switches of the respective current paths.

Figure 13:
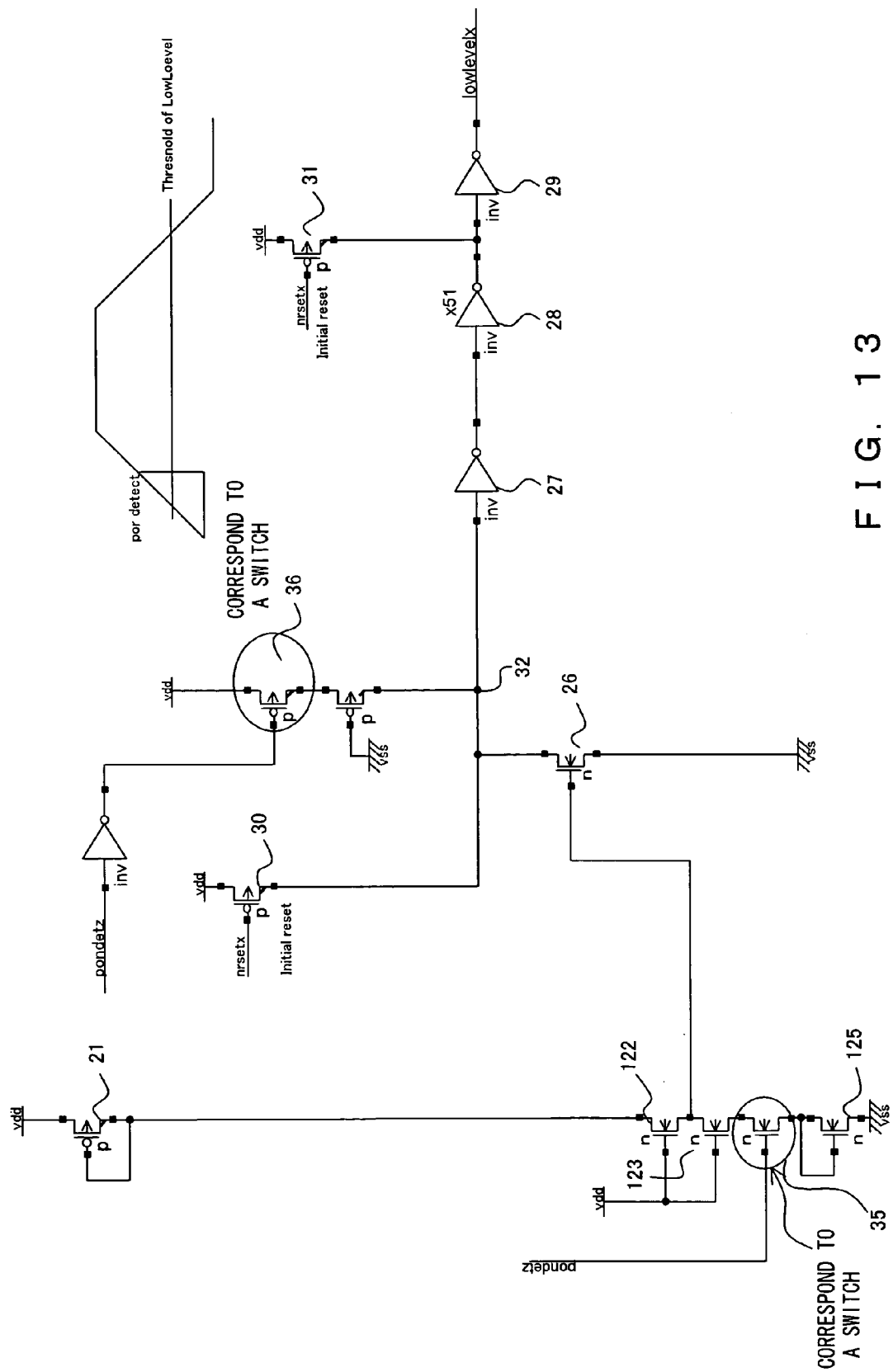
FIG. 13 is the detailed circuit diagram in one preferred embodiment of the power-down detection circuit.

FIG. 13 is the detailed circuit diagram of the power-down detection circuit shown in FIG. 5. The same reference numerals as in FIG. 5 are attached to corresponding devices and their descriptions are omitted.

Furthermore, as another preferred embodiment of the present invention, the output (power-on reset signal) from a power-on reset signal generation circuit can be used to control the power-on detection circuit/power-down detection circuit' switch.

In the circuit configuration of the present invention (FIG. 8A), since there is almost no float in the output (porz) of the power detection signal generation circuit, a more stable circuit operation can be expected by using this signal for the switch of the power-on detection circuit/power-down detection circuit.

Figure 14:
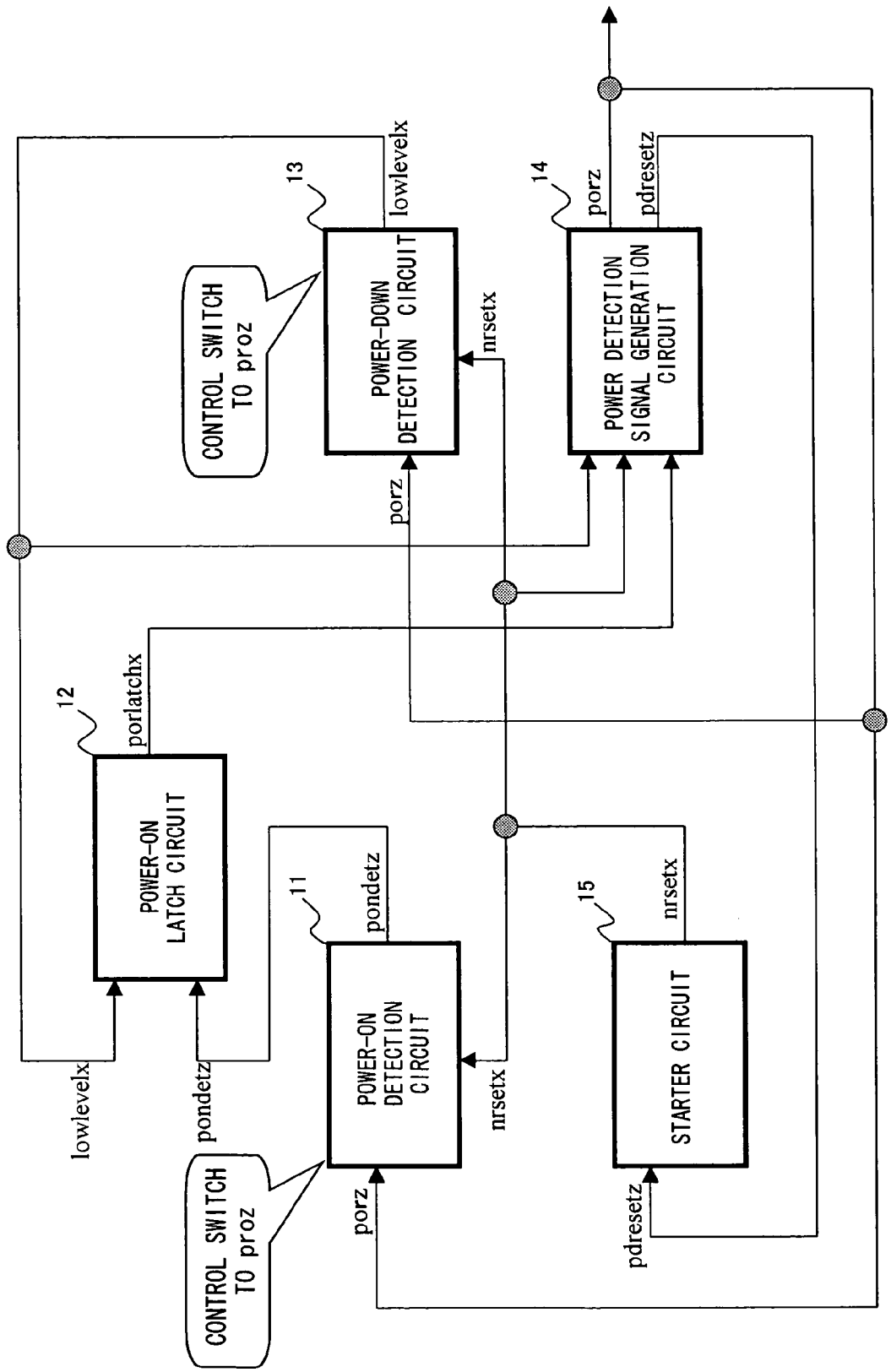
FIG. 14 is the block diagram in another preferred embodiment of the power detection circuit of the present invention.

FIG. 14 shows the block diagram in the case where this output (porz) of the power detection signal generation circuit is used to control the switch.

What is claimed is:

1. A power detection circuit, comprising:
a power-down detection circuit for detecting a first power detection level and generating a detection signal;
a power-on detection circuit for a second power detection level higher than the first power detection level and generating a detection signal;
a latch for maintaining a state of the circuit after a power-on detection; and
a starter circuit comprising a switch coupled to a ground, wherein
the latch in the circuit is initialized by the power-down detection circuit, in response to the detection signal from the power-down detection circuit,
the starter circuit self-stops an operation when an amount of time has passed or continues the operation by a control signal, and
the power detection circuit controls the switch by using the detection signal of the power-down detection circuit to initialize at least the power-down detection circuit and the power-on detection circuit.

2. The power detection circuit according to claim 1, further comprising:
a unit for cutting off a current path inside the power-on detection circuit and the power-down detection circuit, wherein
the cut-off unit is controlled by the detection signal generated by the power-on detection circuit.

3. The power detection circuit according to claim 1, further comprising:
a cut-off unit for cutting off a current path inside the power-on detection circuit and the power-down detection circuit;
a power detection signal generation circuit for receiving the detection signal from the power-down detection circuit,
wherein
the cut-off unit is controlled by a signal indicating the state of the power detection circuit, generated by the power detection signal generation circuit.

4. The power detection circuit according to claim 1 wherein each of the power-down detection circuits and the power-on detection circuits comprise a first conduction type transistor diode-connected on a high potential side, a second conduction type transistor diode-connected on a ground side, and an element for outputting a voltage-dividing voltage between both the transistors.

5. The powe detection circuit according to claim 1, wherein each of the power-on detection circuits and the power-down detection circuits comprise a first conduction type transistor,
wherein
the transistor is conducted by turning on the switch of the starter circuit and initialization is performed.

6. The power detection circuit according to claim 1, further comprising:
a power detection signal generation circuit for receiving the detection signal from the power-down detection circuit,
wherein
the switch is controlled by a power-down reset signal generated by the power detection signal generating circuit.

7. The power detection circuit according to claim 6, wherein
the power detection signal generation circuit comprises a unit for logically operating between an output signal of a power-on latch circuit and a signal which is the output of the power-down detection circuit, in an input unit,
wherein
a level of the output of the power-down detection circuit is defined low since power is switch on, and
a power detection signal is stabilized until the latch circuit is defined.

8. The power detection circuit according to claim 6, wherein
the starter comprises
a resistor connected to a first power supply;
a capacitor connected between the resistor and a second power supply;
an output unit connected to the resistor and the terminal of the capacitor, for outputting a signal for starting the operations of the power-on detection circuit and power-down detection circuit; and
a switch provided between the output unit and a ground for receiving the power-down reset signal.

9. The power detection circuit according to claim 1 further comprising:
a power-on latch circuit of which a state is transited when receiving the detection signal outputted from the power-on detection circuit.

10. The power detection circuit according to claim 9, wherein
the operational stability of the latch circuit is improved by logically operating between the output (pondetz) of the power-on detection circuit and the output (lowlevelx) of the power-down detection circuit in an input unit.

11. The power detection circuit according to claim 9, wherein
the latch circuit comprises a reset terminal controlled by the output (lowlevelx) of the power-down detection circuit and a set terminal controlled by the output (pondetz) of the power-on detection circuit.

12. The power detection circuit according to claim 9, wherein
The power-on latch circuit is initialized by the signal lowlevelx at the time of power switch-on and power-down.

13. A power detection circuit, comprising:
a power-down detection circuit for detecting a first power detection level and generating a detection signal;
a power-on detection circuit for detecting a second power detection level higher than the first power detection level and generating a detection signal; and
a latch for maintaining a state of the circuit after a power-on detection; and
a starter circuit comprising a switch coupled to a ground, wherein
the latch is compulsorily initialized by the power-down detection circuit, in response to the detection signal of the power-down detection circuit by accumulating charge in the power-down detection circuit before the output of the power-on detection circuit reaches the second potential,
the starter circuit self-stops an operation when an amount of time has passed or continues the operation by a control signal, and
the power detection circuit controls the switch by using the detection signal of the power-down detection circuit to initialize at least the power-down detection circuit and the power-on detection circuit.

* * * * *